(12) United States Patent
Ohara (10) Patent No.: US 12,113,552 B2
(45) Date of Patent: Oct. 8, 2024

(54) DELTA-SIGMA MODULATOR

(71) Applicant: Asahi Kasei Microdevices Corporation, Tokyo (JP)

(72) Inventor: Kazuma Ohara, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 173 days.

(21) Appl. No.: 18/066,276

(22) Filed: Dec. 14, 2022

(65) Prior Publication Data

US 2023/0208436 A1 Jun. 29, 2023

(30) Foreign Application Priority Data

Dec. 24, 2021 (JP) .................................. 2021-211074
Oct. 28, 2022 (JP) .................................. 2022-172922

(51) Int. Cl.
*H03M 3/00* (2006.01)
*H03M 3/02* (2006.01)

(52) U.S. Cl.
CPC ............ *H03M 3/466* (2013.01); *H03M 3/43* (2013.01); *H03M 3/464* (2013.01); *H03M 3/02* (2013.01)

(58) Field of Classification Search
CPC ........ H03M 3/466; H03M 3/43; H03M 3/464; H03M 3/02
See application file for complete search history.

(56) References Cited

U.S. PATENT DOCUMENTS

| | | | |
|---|---|---|---|
| 6,340,945 B1 | 1/2002 | Hauptmann | |
| 2008/0165042 A1* | 7/2008 | Hochschild | H03M 7/3011 341/143 |
| 2011/0063155 A1 | 3/2011 | Chen | |
| 2018/0069567 A1 | 3/2018 | Verdant | |
| 2019/0199369 A1 | 6/2019 | Katayama | |

FOREIGN PATENT DOCUMENTS

| | | |
|---|---|---|
| JP | 2003318736 A | 11/2003 |
| JP | 2019118100 A | 7/2019 |

* cited by examiner

*Primary Examiner* — Joseph J Lauture (57) ABSTRACT

Provided is a delta-sigma modulator including a first integral unit configured to integrate an input analog signal, a second integral unit configured to integrate a signal output by the first integral unit, a quantizer configured to quantize a signal output by the second integral unit, a DA converter configured to perform DA conversion on an output of the quantizer and output a feedback signal to be fed back to the first integral unit, and a control unit configured to perform control to cause the first integral unit and the second integral unit to perform different integral operations during a first period and a second period, in which the second integral unit is configured to receive the feedback signal output by the DA converter via the first integral unit and integrate the feedback signal during the first period and the second period.

20 Claims, 6 Drawing Sheets

DELTA-SIGMA MODULATOR

The contents of the following Japanese patent application(s) are incorporated herein by reference:
NO. 2021-211074 filed in JP on Dec. 24, 2021 and
NO. 2022-172922 filed in JP on Oct. 28, 2022.

BACKGROUND

1. Technical Field

The present invention relates to a delta-sigma modulator.

2. Related Art

Up to now, as a technique for achieving high resolution at low power consumption, an incremental delta-sigma modulator has been proposed which is configured to operate as an integrator with a first-order feedback coefficient of 1 until a predetermined period elapses, and operate as an amplifier with a first-order feedback coefficient greater than 1 after the predetermined period has elapsed (for example, see Patent Document 1).

LIST OF CITED REFERENCES

Patent Document

Patent Document 1: Japanese Patent Application Publication No. 2019-118100

DESCRIPTION OF EXEMPLARY EMBODIMENTS

Hereinafter, the present invention will be described by way of embodiments of the invention, but the following embodiments are not intended to limit the invention according to the claims. In addition, not all of the combinations of features described in the embodiments are essential to the solution of the invention.

Figure 1:
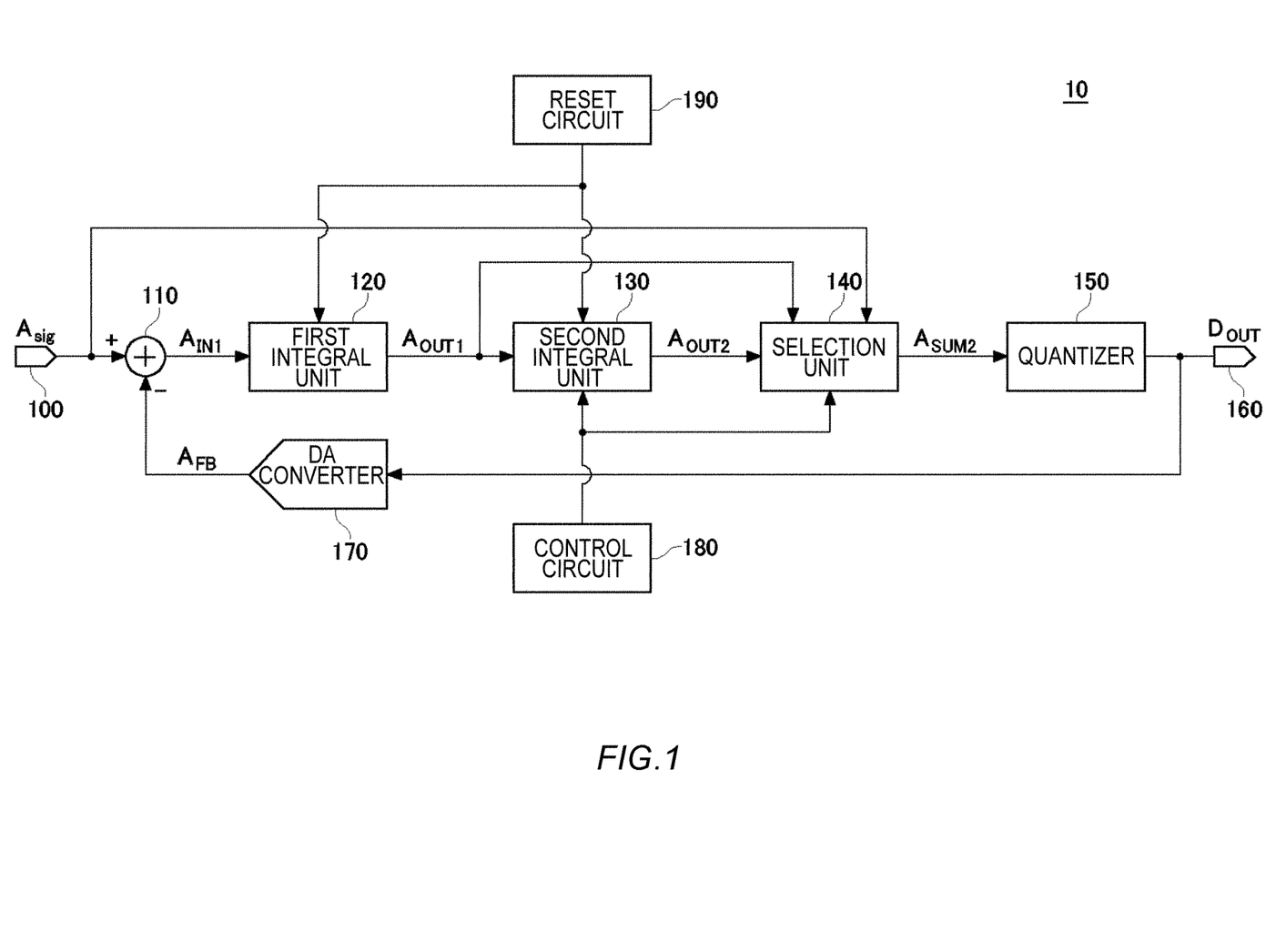
FIG. 1 illustrates an architecture example of a delta-sigma modulator according to the present embodiment.

FIG. 1 illustrates an architecture example of a delta-sigma modulator 10 according to the present embodiment. As an example, a delta-sigma modulator 10 is an incremental analog-to-digital (AD) converter configured to reset after each cycle of AD conversion for converting an input analog signal $A_{sig}$ into a digital signal $D_{out}$. The delta-sigma modulator 10 may achieve high resolution by repeating AD conversion for one cycle formed by a first period and a second period and a reset period after the AD conversion.

The delta-sigma modulator 10 includes an addition and subtraction unit 110, a first integral unit 120, a second integral unit 130, a selection unit 140, a quantizer 150, a digital-to-analog (DA) converter 170, a control circuit 180, and a reset circuit 190. Note that a control unit of the present application may be a control unit having the control circuit 180 and the reset circuit 190 of the present embodiment.

The addition and subtraction unit 110 is connected to an input terminal 100, the first integral unit 120, and the DA converter 170. The addition and subtraction unit 110 is configured to output, to the first integral unit 120, an analog signal $A_{IN1}$ obtained by subtracting a feedback signal $A_{FB}$ output by the DA converter 170 from an analog signal $A_{sig}$ input to the input terminal 100.

The first integral unit 120 is connected to the second integral unit 130 and the selection unit 140, and is configured to integrate the analog signal $A_{sig}$ to be input to the input terminal 100. The first integral unit 120 may be an analog integrator. The first integral unit 120 integrates the analog signal $A_{IN1}$ that is a difference between the analog signal $A_{sig}$ and the feedback signal $A_{FB}$, and outputs an analog signal $A_{OUT1}$ to the second integral unit 130 and the selection unit 140.

The second integral unit 130 is connected to the selection unit 140, and is configured to integrate the analog signal $A_{OUT1}$ output by the first integral unit 120. The second integral unit 130 may be an analog integrator. During the first period and the second period, the second integral unit 130 receives, via the first integral unit 120, the feedback signal $A_{FB}$ output by the DA converter 170 and integrates the feedback signal $A_{FB}$ to output an analog signal $A_{OUT2}$ that is an integration result to the selection unit 140.

The selection unit 140 is connected to the input terminal 100 and the quantizer 150, and is configured to select at least one of the analog signal $A_{sig}$ to be input to the input terminal 100, the analog signal $A_{OUT1}$ output by the first integral unit 120, or the analog signal $A_{OUT2}$ output by the second integral unit 130 to output an analog signal $A_{SIM2}$ according to the selected signal. The selection unit 140 may have an architecture for executing feed forward control of the delta-sigma modulator 10.

The quantizer 150 is connected to an output terminal 160 and the DA converter 170, and is configured to quantize the signal output by the second integral unit 130. The quantizer 150 outputs a digital signal $D_{out}$ obtained by quantizing the analog signal $A_{SIM2}$ output by the selection unit 140. The quantizer 150 may quantize the analog signal $A_{SIM2}$ according to a clock signal supplied from outside. The quantizer 150 may function as a 1-bit quantizer and perform quantization to output a binary digital signal $D_{out}$. Instead of this, the quantizer 150 may function as a multi-bit quantizer and perform quantization to output a multi-value digital signal $D_{out}$.

The DA converter 170 is configured to perform digital-to-analog conversion (DA conversion) of an output $D_{OUT}$ of the quantizer 150 to output the feedback signal $A_{FB}$ to be fed back to the first integral unit 120. The DA converter 170 may convert, in synchronism with a clock signal or the like, the digital signal $D_{OUT}$ into the feedback signal $A_{FB}$ that is an analog signal.

The control circuit 180 is connected to the second integral unit 130 and the selection unit 140, and is configured to output a control signal for switching operations of the second integral unit 130 and the selection unit 140. The control circuit 180 may switch the operations of the second integral unit 130 and the selection unit 140 at predetermined timing. The control circuit 180 may output different control signals to the second integral unit 130 and the selection unit 140. In addition, the control circuit 180 may perform notification on timing at which a reset signal should be supplied to the reset circuit 190.

The reset circuit 190 is connected to the first integral unit 120 and the second integral unit 130, and is configured to output a reset signal for resetting an output $A_{OUT}$ of the first integral unit 120 and the second integral unit 130 for each predetermined cycle. The first integral unit 120 and the second integral unit 130 are controlled so as to perform different integral operations during the first period and the second period by the control signal from the control circuit 180 and the reset signal from the reset circuit 190.

Figure 2:
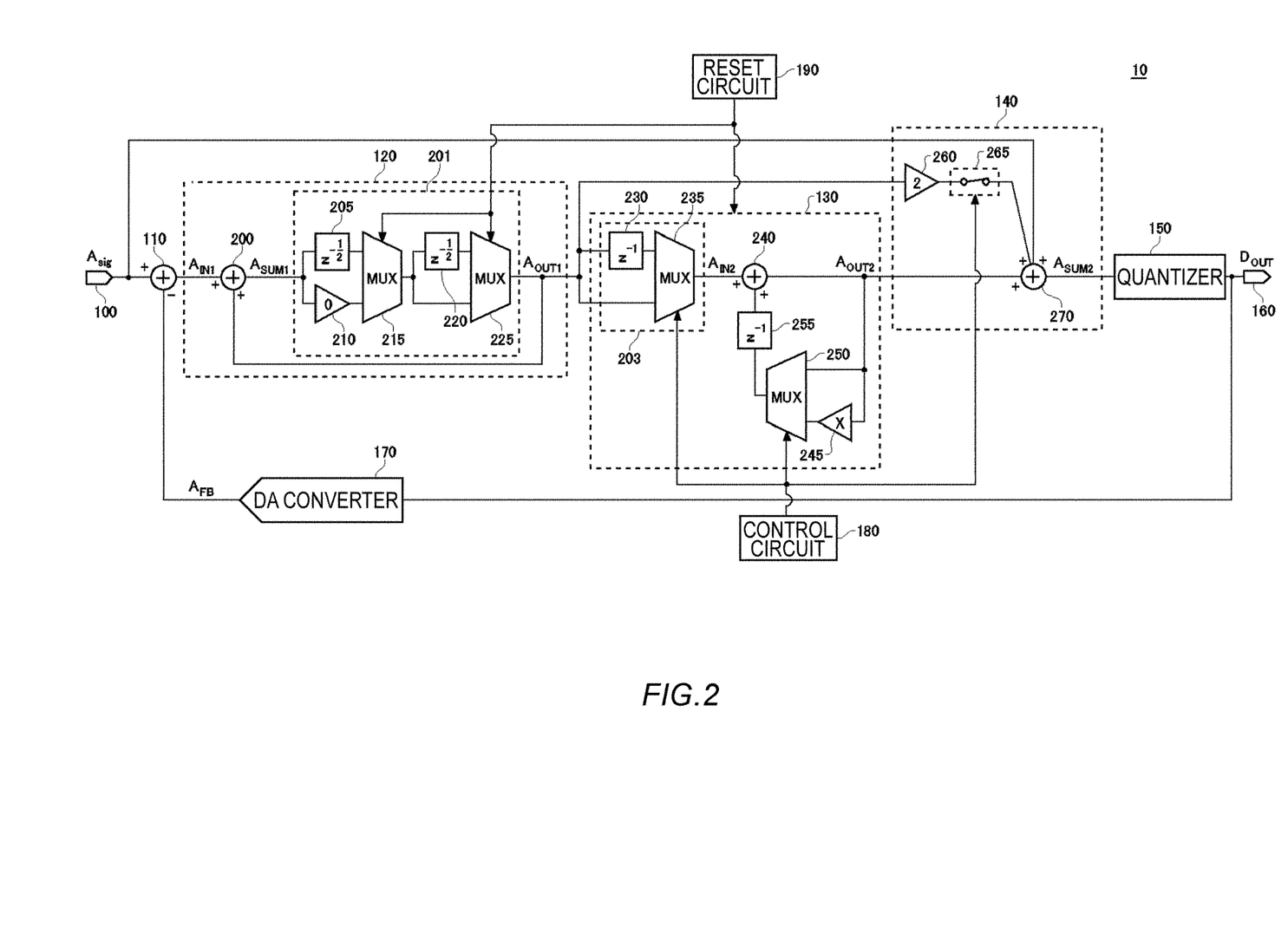
FIG. 2 illustrates a more detailed architecture example of the delta-sigma modulator according to the present embodiment.

FIG. 2 illustrates a more detailed architecture example of the delta-sigma modulator 10 according to the present embodiment. FIG. 2 illustrates the first integral unit 120, the second integral unit 130, and the selection unit 140 in the delta-sigma modulator 10 of FIG. 1 in more detail. Hereinafter, these components will be described in more detail.

The first integral unit 120 has a first addition unit 200 and a first switching unit 201, and has a feedback path for returning an output of the first switching unit 201 to an input of the first addition unit 200. The first addition unit 200 is connected to the addition and subtraction unit 110, the feedback path, and an input of the first switching unit 201, and a signal according to the feedback signal $A_{FB}$ is input to the first addition unit 200 via the addition and subtraction unit 110. The first addition unit 200 is configured to add the analog signal $A_{IN1}$ from the addition and subtraction unit 110 to the analog signal $A_{OUT1}$ from the first switching unit 201 to output an analog signal $A_{SUM1}$ to the first switching unit 201.

The first switching unit 201 is configured to output the analog signal $A_{SUM1}$, which is to be output by the first addition unit 200, at a gain of 1 during the first period, and to alternately output the analog signal $A_{SUM1}$ at a gain of 1 and a gain of 0 during the second period. The first switching unit 201 has a first delay element 205, a first amplifier 210, a first multiplexer 215, a second delay element 220, and a second multiplexer 225.

The first delay element 205 is connected between the first addition unit 200 and one of inputs of the first multiplexer 215, and is configured to output the signal $A_{SUM1}$ from the first addition unit 200 with delay. The first amplifier 210 is connected between the first addition unit 200 and the other input of the first multiplexer 215, and is configured to output the signal $A_{SUM1}$, which is output by the first addition unit 200, at a gain of 0 (that is, 0 V). An output of the first multiplexer 215 is connected to the second delay element 220 and one of inputs of the second multiplexer 225, and an output of the first delay element 205 and an output of the first amplifier 210 are input to the first multiplexer 215. The first multiplexer 215 is configured to output one of the output of the first delay element 205 and the output of the first amplifier 210 according to a reset signal. According to the reset signal, the first multiplexer 215 may output the signal output by the first amplifier 210 at a gain of 0 during a reset period.

The second delay element 220 is connected between the output of the first multiplexer 215 and the other input of the second multiplexer 225, and is configured to output the signal from the first multiplexer 215 with delay. An output of the second multiplexer 225 is connected to the second integral unit 130 and the input of the first addition unit 200. An output of the second delay element 220 and an output of the first multiplexer 215 are input to the second multiplexer 225, and according to the reset signal, the second multiplexer 225 is configured to output one of the output of the second delay element 220 and the output of the first multiplexer 215.

In accordance with such a structure, the first integral unit 120 outputs the signal $A_{OUT1}$ via a same feedback path during both the first period and the second period. Therefore, the signal $A_{OUT1}$ according to the feedback signal which is output from the first integral unit 120 is input to the second integral unit 130 under same conditions (such as noise and a phase) during the first period and the second period. With this architecture, the first integral unit 120 and the second integral unit 130 can use the feedback signal $A_{FB}$ from the only single DA converter 170 without additionally performing an adjustment on the conditions or the like during the first period and the second period.

The second integral unit 130 has a second switching unit 203, a second addition unit 240, a second amplifier 245, a fourth multiplexer 250, and a fourth delay element 255. The second integral unit 130 has a feedback path for returning an output of the second addition unit 240 to an input of the second addition unit 240 via the second amplifier 245, the fourth multiplexer 250, and the fourth delay element 255.

The second switching unit 203 is configured to output the signal $A_{OUT1}$ from the first integral unit 120 with delay during the first period, and to output the signal $A_{OUT1}$ from the first integral unit 120 without delay during the second period. The second switching unit 203 has a third delay element 230 and a third multiplexer 235. The third delay element 230 is connected between the first integral unit 120 and one of inputs of the third multiplexer 235, and is configured to output, with delay, the signal $A_{OUT1}$ output by the first integral unit 120. The other input of the third multiplexer 235 is connected to the first integral unit 120, and an output of the third multiplexer 235 is connected to an input of the second addition unit 240. The third multiplexer 235 is configured to output one of an output of the third delay element 230 and an output of the first integral unit 120 according to a control signal. The third multiplexer 235 may output the signal from the third delay element 230 during the first period, and output the signal $A_{OUT1}$ from the first integral unit 120 during the second period.

The second addition unit 240 is configured to add an analog signal $A_{IN2}$ from the third multiplexer 235 to an analog signal from the feedback path, and output the analog signal $A_{OUT2}$ that is an addition result. The second amplifier 245 is connected between the output of the second addition unit 240 and one of inputs of the fourth multiplexer 250, and is configured to amplify the analog signal $A_{OUT2}$ from the second addition unit 240 by a multiplying factor x (x>1) to be output. The other input of the fourth multiplexer 250 is connected to the output of the second addition unit 240, and an output of the fourth multiplexer 250 is connected to the fourth delay element 255. The fourth multiplexer 250 is configured to output one of the output of the second addition unit 240 and the output of the second amplifier 245 according to a control signal. The fourth delay element 255 is connected to the second addition unit 240, and is configured to output a signal from the fourth multiplexer 250 to the second addition unit 240 with delay.

The fourth multiplexer 250 may output the signal $A_{OUT2}$ from the second addition unit 240 during the first period, and output the signal from the second amplifier 245 during the second period.

The selection unit 140 has a third amplifier 260, a first switch 265, and a third addition unit 270. The third amplifier 260 is connected between the output of the first integral unit 120 and the first switch 265, and is configured to amplify the analog signal $A_{OUT1}$ from the first integral unit 120 by a multiplying factor greater than 1 (for example, a multiplying factor of 2 according to the present embodiment) to be output. One end of the first switch 265 is connected to the third addition unit 270, and is configured to be turned on/off to connect/disconnect the third amplifier 260 and the third addition unit 270 according to a control signal. The third addition unit 270 is connected to the quantizer 150. The analog signal $A_{sig}$ from the input terminal 100, the analog signal $A_{OUT1}$ from the first integral unit 120, and the analog signal $A_{OUT2}$ from the second integral unit 130 are input to the third addition unit 270, and the third addition unit 270 is configured to add those signals and output the analog signal $A_{SUM2}$. The selection unit 140 may add and output the analog signals $A_{sig}$, $2A_{OUT1}$, and $A_{OUT2}$ during the first period, and add and output the analog signals $A_{sig}$ and $A_{OUT2}$ during the second period.

Next, an operation of the delta-sigma modulator 10 according to the present embodiment will be described. The control circuit 180 and the reset circuit 190 may control the first integral unit 120 to be caused to operate as an integrator in which a feedback coefficient during the second period is lower than that during the first period, and may control the second integral unit 130 to be caused to operate as an integrator in which a feedback coefficient during the second period is higher than that during the first period. For example, the control circuit 180 and the reset circuit 190 may control the first integral unit 120 to be caused to operate as an integrator with a feedback coefficient of 1 during the first period and to operate as an integrator with a feedback coefficient of 0 during the second period, and may control the second integral unit 130 to be caused to operate as an integrator with a feedback coefficient of 1 during the first period and to operate as an integrator with a feedback coefficient greater than 1 during the second period.

Herein, the feedback coefficient indicates a multiplying factor of an amplifier arranged on the feedback path which is included in each of the first integral unit 120 and the second integral unit 130. For example, on a path from the output to the input of the addition unit of the first integral unit 120 and the second integral unit 130, when a signal input to the path is caused to pass without the intermediation of an amplifier, the feedback coefficient is 1, and when the signal input to the path is caused to pass via an amplifier with a multiplying factor of x, the feedback coefficient is X.

During the first period, in the first integral unit 120, the first multiplexer 215 may output the signal from the first delay element 205 according to a reset signal, and the second multiplexer 225 may output the signal from the second delay element 220 according to a reset signal. During the second period, in the first integral unit 120, the first multiplexer 215 may output the signal from the first amplifier 210 at the multiplying factor of 0 according to a reset signal, and the second multiplexer 225 may output the input signal without the intermediation of the second delay element 220 according to a reset signal. With this architecture, during the first period, the analog signal $A_{OUT1}$ output by the first integral unit 120 is represented by a following equation.

$$A_{OUT1} = \frac{z^{-1}}{1-z^{-1}} A_{IN1} \qquad \text{[Math. 1]}$$

In addition, during the second period, the analog signal $A_{OUT1}$ output by the first integral unit 120 is represented by a following equation. During the second period, since the first integral unit 120 operates as a delay element that does not have a feedback coefficient and a gain is 1, the first integral unit 120 outputs, to the second integral unit 130, the feedback signal $A_{FB}$ output by the DA converter 170 at a gain same as a gain at a time when the feedback signal $A_{FB}$ is input to the first integral unit 120 during the second period.

$$A_{OUT1} = z^{-1} A_{IN1} \qquad \text{[Math. 2]}$$

During the first period, in the second integral unit 130, the third multiplexer 235 may output the delayed signal from the third delay element 230 according to a control signal, and during the second period, the third multiplexer 235 may output the input signal $A_{OUT1}$ with the intermediation of the third delay element 230 according to a control signal. In addition, during the first period, in the second integral unit 130, the fourth multiplexer 250 may output the input signal with the intermediation of the second amplifier 245 according to a control signal, and during the second period, the fourth multiplexer 250 may output the signal amplified by x times from the second amplifier 245 according to a control signal. During the first period and the second period, the fourth delay element 255 delays and outputs the signal from the fourth multiplexer 250.

The second addition unit 240 outputs the analog signal $A_{OUT2}$ that is a result of the addition of the signals that are to be input. With this architecture, during the first period, the analog signal $A_{OUT2}$ output by the second integral unit 130 is represented by a following equation.

$$A_{OUT2} = \frac{z^{-1}}{1-z^{-1}} A_{IN2} \qquad \text{[Math. 3]}$$

In addition, during the second period, the analog signal $A_{OUT2}$ output by the second integral unit 130 is represented by a following equation. As represented by the following equation, since a numerator of the coefficient of $A_{IN2}$ is 1 during the second period, the second integral unit 130 can use the signal according to the feedback signal $A_{FB}$ from the DA converter 170 under the same conditions as those of the first integral unit 120.

$$A_{OUT2} = \frac{1}{1-xz^{-1}} A_{IN2} \qquad \text{[Math. 4]}$$

In the selection unit 140, the first switch 265 is turned on by a control signal during the first period, and turned off by a control signal during the second period. Therefore, the selection unit 140 outputs the analog signal $A_{SUM2}$ of a following equation during the first period.

$$A_{SUM2} = A_{SIG} + 2A_{OUT1} + A_{OUT2} \qquad \text{[Math. 5]}$$

In addition, the selection unit 140 outputs the analog signal $A_{SIM2}$ of a following equation during the second period.

$$A_{SUM2} = A_{SIG} + A_{OUT2} \qquad \text{[Math. 6]}$$

The delta-sigma modulator 10 according to the present embodiment may obtain two types of outputs by switching circuit operations during the first period and the second period by the control circuit 180 and the reset circuit 190. When quantization noise generated in the quantizer 150 is set as E1, the output $D_{OUT}$ of the delta-sigma modulator 10 is represented by a following equation during the first period.

$$D_{OUT} = A_{SUM2} + E_1 = \quad \text{[Math. 7]}$$

$$\left(A_{SIG} + 2\left(\frac{z^{-1}}{1-z^{-1}}\right)(A_{SIG} - D_{OUT})\right) + \left(\frac{z^{-1}}{1-z^{-1}}\right)^2 (A_{SIG} - D_{OUT}) +$$

$$E_1 \left(\frac{1}{1-z^{-1}}\right)^2 D_{OUT} = \left(\frac{1}{1-z^{-1}}\right)^2 A_{SIG} + E_1$$

Where, in a case where an initial value of an output signal $A_{OUT}$ of the first integral unit 120 and the second integral unit 130 is 0 and the analog signal $A_{sig}$ to be input to the delta-sigma modulator 10 is a substantially constant value, when an output of the quantizer 150 at an i-th time (i>1) is set as $D_{OUT}(i)$, the analog signal $A_{sig}$ is represented by a following equation.

$$\sum_{i=0}^{n-1}\sum_{j=0}^{i-1} D_{OUT}(j) = \frac{n(n-1)}{2!} A_{SIG} + E_1(n) \quad \text{[Math. 8]}$$

$$A_{SIG} = \frac{\sum_{i=0}^{n-1}\sum_{j=0}^{i-1} D_{OUT}(j)}{\frac{n(n-1)}{2!}} - E_1(n)$$

The analog signal $A_{sig}$ to be input to the delta-sigma modulator 10 is represented by using the output $D_{OUT}$ of the quantizer 150, and a digital signal $D_{SIG}$ obtained by digitally converting the analog signal $A_{sig}$ can be calculated. In addition, the quantization noise E1 of the quantizer 150 at this time is represented by a following equation.

$$E_1(n-2) = -A_{OUT2}(n) = \sum_{i=0}^{n-1}\sum_{j=0}^{i-1} D_{OUT}(j) - \frac{n(n-1)}{2!} A_{SIG} \quad \text{[Math. 9]}$$

In addition, an output $A_{OUT2}$ of the second integral unit 130 is represented by a following equation during the second period.

$$A_{OUT2} = \left(x A_{OUT2}(n) + \frac{z^{-1}}{1-xz^{-1}}(A_{SIG} - D_{OUT})\right) \quad \text{[Math. 10]}$$

Where, the number of clocks to be input is set as m, and an integrator with a feedback coefficient greater than 1 is represented by a following equation.

$$\frac{z^{-1}}{1-xz^{-1}} = \frac{x^m - 1}{x - 1} \quad \text{[Math. 11]}$$

In addition, since an initial value of the second integral unit 130 is $A_{OUT2}(n)$, $A_{SIG}$ is represented by a following equation.

$$A_{OUT2} = \left(x^m \left(-\sum_{i=0}^{n-1}\sum_{j=0}^{i-1} D_{OUT}(j) + \frac{n(n-1)}{2!} A_{SIG}\right) + \frac{x^m - 1}{x - 1}(A_{SIG} - D_{OUT})\right) \quad \text{[Math. 12]}$$

-continued $$A_{SIG} = \frac{x^m \sum_{i=0}^{n-1}\sum_{j=0}^{i-1} D_{OUT}(j) + \frac{x^m - 1}{x - 1} D_{OUT}}{x^m \frac{n(n-1)}{2!} + \frac{x^m - 1}{x - 1}} - \frac{A_{OUT2}}{x^m \frac{n(n-1)}{2!} + \frac{x^m - 1}{x - 1}}$$

Therefore, the analog signal $A_{SIG}$ to be input to the delta-sigma modulator 10 can be represented by using the output $D_{OUT}$ of the quantizer 150, and the digital signal $D_{SIG}$ obtained by digitally converting the analog signal $A_{SIG}$ can be calculated.

Figure 3:
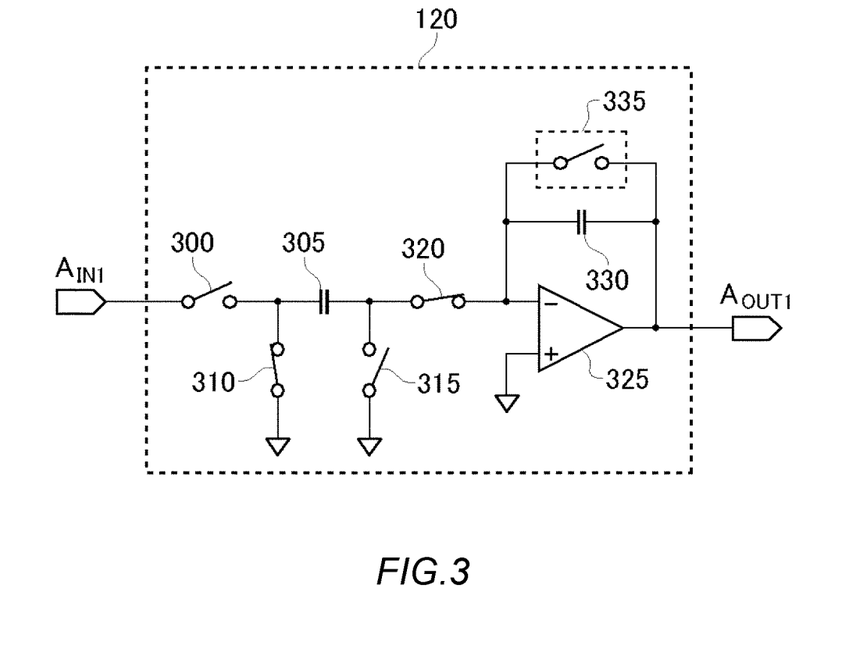
FIG. 3 illustrates an example of a circuit of a first integral unit of the delta-sigma modulator according to the present embodiment.

FIG. 3 illustrates an example of a circuit of the first integral unit 120 of the delta-sigma modulator 10 according to the present embodiment. The first integral unit 120 has a second switch 300, a third switch 310, a first capacitor 305, a fourth switch 320, a fifth switch 315, a fourth amplifier 325, a first feedback capacitor 330, and a first reset switch 335.

The second switch 300 is connected between the input of the first integral unit 120 and the first capacitor 305. The third switch 310 is connected between a node between the second switch 300 and the first capacitor 305, and a reference potential. The first capacitor 305 is connected between the second switch 300 and the fourth switch 320. The fourth switch 320 is connected to one of terminals of the fourth amplifier 325. The fifth switch 315 is connected between a node between the fourth switch 320 and the first capacitor 305, and the reference potential. The second switch 300, the third switch 310, the first capacitor 305, the fourth switch 320, and the fifth switch 315 constitutes a switched capacitor circuit. The second switch 300 and the fifth switch 315 may be turned on when a first timing signal is high, and may be turned off when the first timing signal is low. The third switch 310 and the fourth switch 320 may be turned on when a second timing signal is high, and may be turned off when the second timing signal is low.

Note that the first timing signal and the second timing signal may alternately become high and are signals in synchronism at a substantially constant clock cycle, and the same also applies below. In addition, the reference potential may be a predetermined potential and is 0 V (ground potential) as an example, and the same also applies below.

For example, during a period ϕ1 in which the first timing signal is high, one side of the first capacitor 305 is connected to an input terminal of the first integral unit 120, and the other side is connected to the reference potential to charge the analog signal $A_{IN1}$ from the input terminal. In this case, during a period ϕ2 in which the second timing signal is high, one side of the first capacitor 305 is connected to the reference potential, and the other side is connected to one of input terminals of the fourth amplifiers 325 to discharge the charged electric charge. The first capacitor 305 is configured to repeat the period ϕ1 and the period ϕ2 to repeat charge and discharge.

One end of the fourth switch 320 is connected to one of the input terminals (negative terminal) of the fourth amplifier 325, the reference potential is connected to the other input terminal (positive terminal), and an output terminal of the first integral unit 120 is connected to an output terminal of the fourth amplifier 325. The first feedback capacitor 330 is connected between one of the input terminals (negative terminal) and the output terminal of the fourth amplifier 325. The first feedback capacitor 330 is configured to accumulate an input signal to one of the input terminals of the fourth amplifier 325. The first reset switch 335 is connected between one of input terminals (negative terminal) and the output terminal of the fourth amplifier 325, and is connected in parallel with the first feedback capacitor 330. The first reset switch 335 can be turned on and off, and then turned on according to a reset signal to discharge the electric charge charged in the first feedback capacitor 330, and the output of the first integral unit 120 (the fourth amplifier 325) can be set to 0 V.

Figure 4:
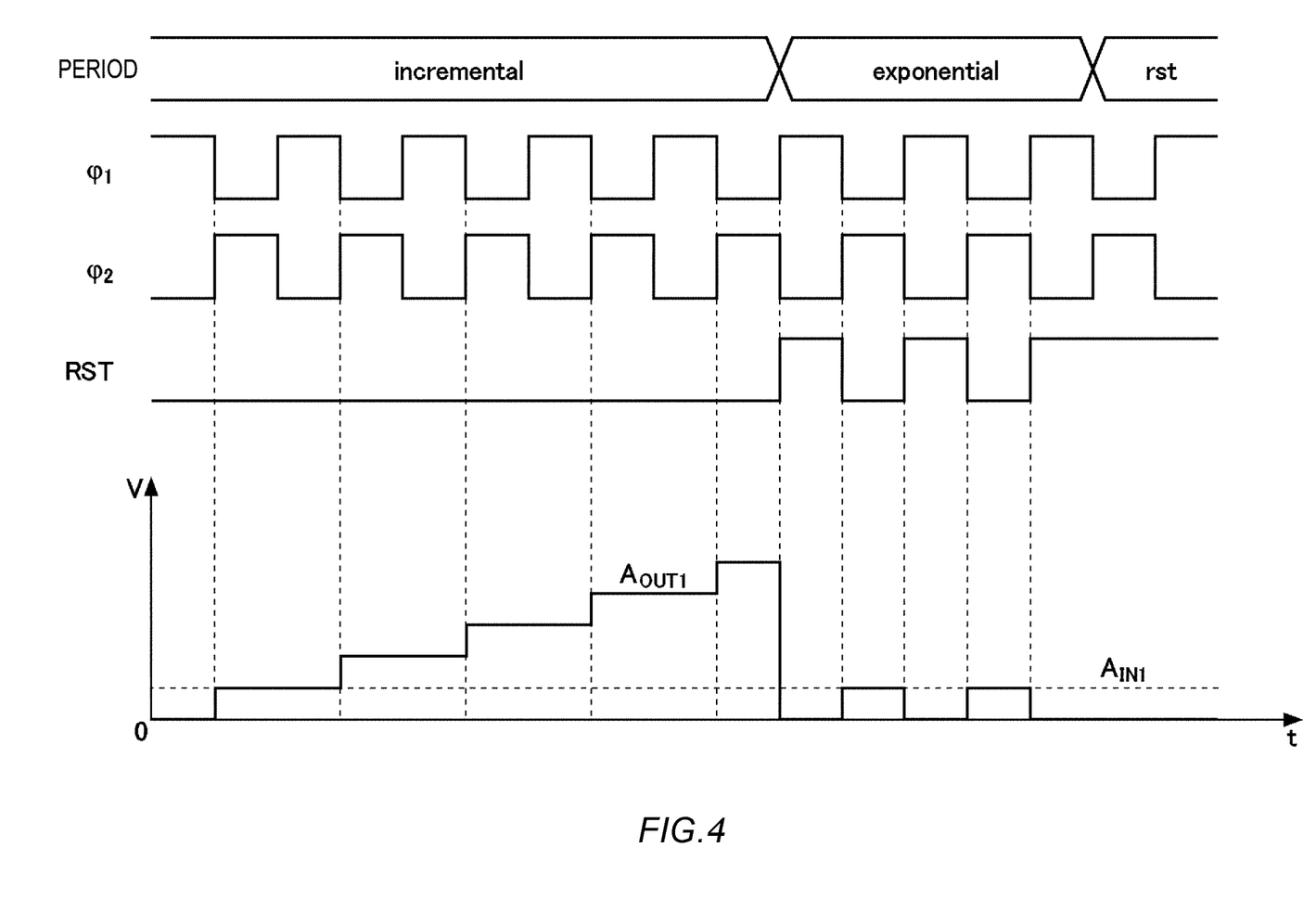
FIG. 4 illustrates an example of an operation characteristic of the first integral unit.

FIG. 4 illustrates an example of an operation characteristic of the first integral unit 120. In FIG. 4, a period of incremental indicates the first period, a period of exponential indicates the second period, and a period of rst indicates the reset period. A horizontal axis and a vertical axis of FIG. 4 represent time and a voltage, respectively. FIG. 4 illustrates an example of the first timing signal during a period ϕ1 and the second timing signal during a period ϕ2, an example of the reset signal (RST), and the output signal $A_{OUT1}$ from the output terminal of the first integral unit 120. That is, during the period ϕ1 and the period ϕ2, on and off are switched at a predetermined cycle, and the reset signal becomes high during the reset period. In addition, FIG. 4 illustrates an example in which the analog signal $A_{IN1}$ to be input to the first integral unit 120 is 0 V until a time point 0, and is a substantially constant potential from the time point 0.

The output signal $A_{OUT1}$ of the first integral unit 120 described above changes according to a timing signal at an n cycle (that is, charge and discharge performed n times) during the first period. That is, the first integral unit 120 operates so as to amplify the analog signal $A_{IN}$ to be input by n times ($A_{OUT1}=nA_{IN1}$). Where, n corresponds to the number of clocks to be input.

During the second period, the reset signal RST rises in synchronism with the first timing signal, and falls. With this architecture, the output signal $A_{OUT1}$ of the first integral unit 120 during the second period becomes 0 V during the period ϕ1 in which the first timing signal is high. In addition, with regard to the output signal $A_{OUT1}$ of the first integral unit 120, since the first integral unit 120 amplifies the input analog signal $A_{sig}$ again during the period ϕ2 in which the second timing signal is high, $A_{OUT1}=A_{IN1}$ is established. In this manner, during the second period, the first integral unit 120 outputs the feedback signal, which is output by the DA converter 170, to the second integral unit 130 at a same gain as that at a time when the feedback signal is input to the first integral unit 120.

During the reset period in which the reset signal maintains high, with regard to the output signal $A_{OUT1}$ of the first integral unit 120, irrespective of the period ϕ1 and period ϕ2, $A_{OUT1}=0$ V is established.

Figure 5:
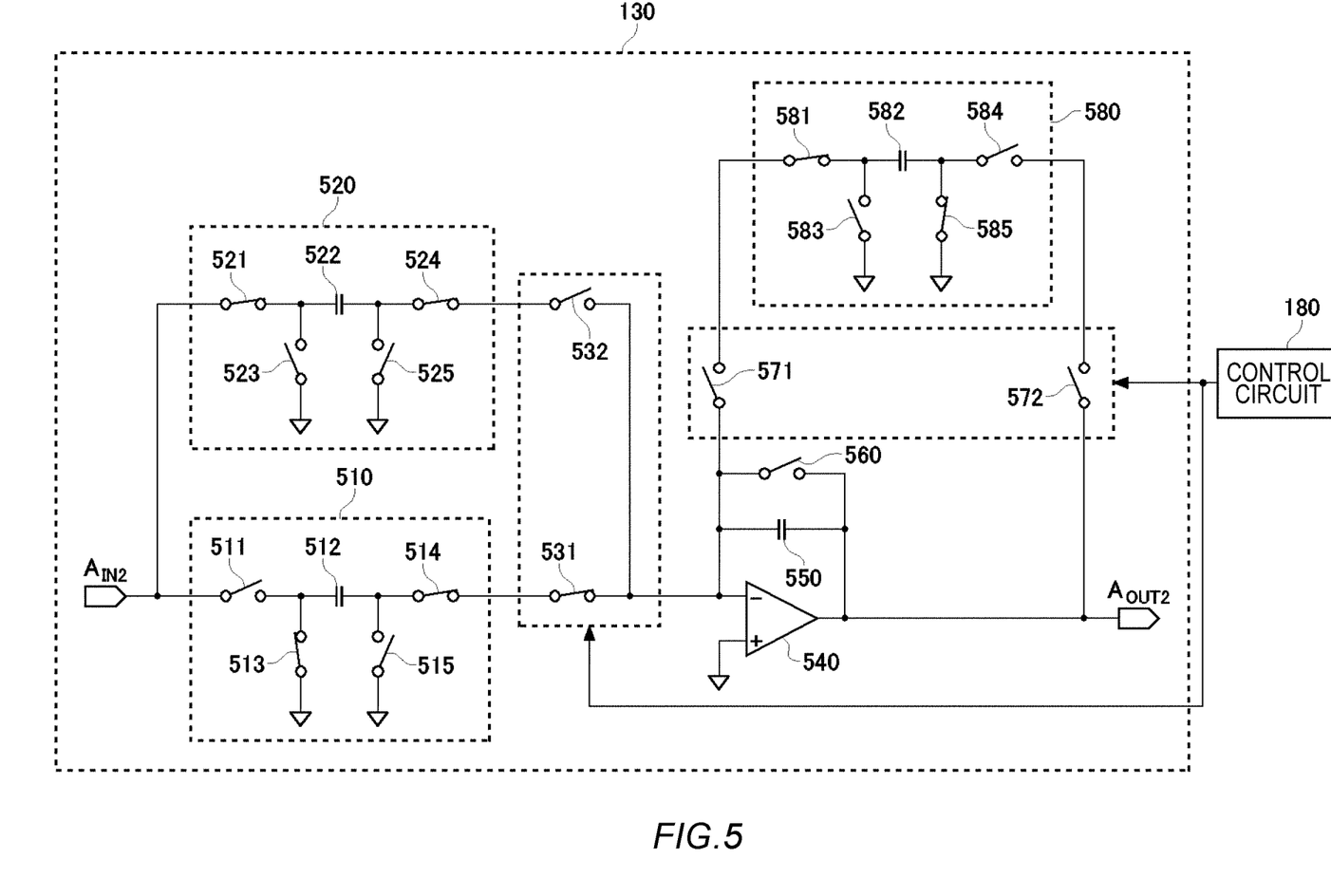
FIG. 5 illustrates an example of a circuit of a second integral unit of the delta-sigma modulator according to the present embodiment.

FIG. 5 illustrates an example of a circuit of the second integral unit 130 of the delta-sigma modulator 10 according to the present embodiment. The second integral unit 130 has a first switched capacitor circuit 510, a second switched capacitor circuit 520, a first switching switch 531, a second switching switch 532, a fifth amplifier 540, a second feedback capacitor 550, a second reset switch 560, a third switching switch 571, a fourth switching switch 572, and a third switched capacitor circuit 580. The first switched capacitor circuit 510, the second switched capacitor circuit 520, the first switching switch 531, and the second switching switch 532 constitute the second switching unit 203 of FIG. 2.

The first switched capacitor circuit 510 is connected between the output of the first integral unit 120 and the first switching switch 531. The first switched capacitor circuit 510 has a sixth switch 511, a seventh switch 513, a third capacitor 512, an eighth switch 514, and a ninth switch 515. The sixth switch 511 is connected between an input terminal of the second integral unit 130 and the third capacitor 512. The seventh switch 513 is connected between a node between the sixth switch 511 and the third capacitor 512, and the reference potential. The third capacitor 512 is connected between the sixth switch 511 and the eighth switch 514. The eighth switch 514 is connected between the first switching switch 531 and the third capacitor 512. The ninth switch 515 is connected between a node between the eighth switch 514 and the third capacitor 512, and the reference potential.

The sixth switch 511 and the ninth switch 515 may be turned on when the first timing signal is high, and may be turned off when the first timing signal is low. The seventh switch 513 and the eighth switch 514 may be turned on when the second timing signal is high, and may be turned off when the second timing signal is low.

For example, during the period ϕ1 in which the first timing signal is high, one side of the third capacitor 512 is connected to the input terminal of the second integral unit 130, and the other side is connected to the reference potential to charge the analog signal $A_{IN2}$ from the input terminal. In addition, during the period ϕ2 in which the second timing signal is high, one side of the third capacitor 512 is connected to the reference potential, and the other side is connected to the first switching switch 531 to discharge the charged electric charge to the fifth amplifier 540 when the first switching switch 531 is on. The third capacitor 512 is configured to repeat the period 41 and the period ϕ2 to repeat charge and discharge.

The second switched capacitor circuit 520 is connected between the output of the first integral unit 120 and the second switching switch 532, and is connected in parallel with the first switched capacitor circuit 510. The second switched capacitor circuit 520 has a tenth switch 521, an eleventh switch 523, a fourth capacitor 522, a twelfth switch 524, and a thirteenth switch 525. The tenth switch 521 is connected between the input terminal of the second integral unit 130 and the fourth capacitor 522. The eleventh switch 523 is connected between a node between the tenth switch 521 and the fourth capacitor 522, and the reference potential. The fourth capacitor 522 is connected between the tenth switch 521 and the twelfth switch 524. The twelfth switch 524 is connected between the second switching switch 532 and the fourth capacitor 522. The thirteenth switch 525 is connected between a node between the twelfth switch 524 and the fourth capacitor 522, and the reference potential.

The eleventh switch 523 and the thirteenth switch 525 may be turned on when the first timing signal is high, and may be turned off when the first timing signal is low. The tenth switch 521 and the twelfth switch 524 may be turned on when the second timing signal is high, and may be turned off when the second timing signal is low.

For example, during the period ϕ2 in which the second timing signal is high, one side of the fourth capacitor 522 is connected to the input terminal of the second integral unit 130, and the other one is connected to the second switching switch 532, and when the second switching switch 532 is on, the analog signal $A_{IN2}$ from the input terminal is output to the fifth amplifier 540 without delay. In addition, during the period ϕ1 in which the first timing signal is high, both sides of the fourth capacitor 522 are connected to the reference potential to discharge the electric charge to the reference potential. The fourth capacitor 522 is configured to repeat the period ϕ1 and period 42 to repeat charge and discharge.

The first switching switch 531 is connected between the first switched capacitor circuit 510 and the fifth amplifier 540. The first switching switch 531 is turned on/off according to a control signal from the control circuit 180. The first switching switch 531 may be turned on during the first period and may be turned off during the second period. The second switching switch 532 is connected between the second switched capacitor circuit 520 and the fifth amplifier 540. The second switching switch 532 is turned on/off according to a control signal from the control circuit 180. The second switching switch 532 may be turned on during the second period and may be turned off during the first period.

In this manner, the control circuit 180 may turn on the first switching switch 531 and turn off the second switching switch 532 during the first period to discharge from the first switched capacitor circuit 510, so that the signal $A_{IN2}$ from the first integral unit 120 may be output with delay. The control circuit 180 may perform control so as to turn on the second switching switch 532 and turn off the first switching switch 531 during the second period to discharge from the second switched capacitor circuit 520, so that the signal $A_{IN2}$ from the first integral unit 120 may be output without delay during the second period.

The first switching switch 531 and one end of the second switching switch 532 are connected to one of input terminals (negative terminal) of the fifth amplifier 540, the reference potential is connected to the other input terminal (positive terminal), and the output terminal of the second integral unit 130 is connected to an output terminal of the fifth amplifier 540. The second feedback capacitor 550 is connected between one of input terminals (negative terminal) and the output terminal of the fifth amplifier 540. The second feedback capacitor 550 is configured to accumulate an input signal to one of the input terminals of the fifth amplifier 540. The second reset switch 560 is connected between one of the input terminals (negative terminal) and the output terminal of the fifth amplifier 540, and is connected in parallel with the second feedback capacitor 550. The second reset switch 560 can be turned on according to a reset signal to discharge the electric charge charged in the second feedback capacitor 550, and the output of the second integral unit 130 (the fifth amplifier 540) can be set to 0 V.

The third switching switch 571 is connected between one of the input terminals (negative terminal) of the fifth amplifier 540 and the third switched capacitor circuit 580. The third switching switch 571 is turned on/off according to a control signal from the control circuit 180. The fourth switching switch 572 is connected between the output terminal of the fifth amplifier 540 and the third switched capacitor circuit 580. The fourth switching switch 572 is turned on/off according to a control signal from the control circuit 180.

The third switched capacitor circuit 580 is connected between the third switching switch 571 and the fourth switching switch 572, and when the third switching switch 571 and the fourth switching switch 572 are turned on, the third switched capacitor circuit 580 is connected in parallel with the second feedback capacitor 550. The third switched capacitor circuit 580 has a fourteenth switch 581, a fifteenth switch 583, a fifth capacitor 582, a sixteenth switch 584, and a seventeenth switch 585.

The fourteenth switch 581 is connected between one of input terminals of the fifth amplifier 540 and the fifth capacitor 582. The fifteenth switch 583 is connected between a node between the fourteenth switch 581 and the fifth capacitor 582, and the reference potential. The fifth capacitor 582 is connected between the fourteenth switch 581 and the sixteenth switch 584. The sixteenth switch 584 is connected between the fourth switching switch 572 and the fifth capacitor 582. The seventeenth switch 585 is connected between a node between the sixteenth switch 584 and the fifth capacitor 582, and the reference potential.

The fifteenth switch 583 and the sixteenth switch 584 may be turned on when the first timing signal is high, and may be turned off when the first timing signal is low. The fourteenth switch 581 and the seventeenth switch 585 may be turned on when the second timing signal is high, and may be turned off when the second timing signal is low.

For example, when the third switching switch 571 and the fourth switching switch 572 are on, during the period φ2 in which the second timing signal is high, one side of the fifth capacitor 582 is connected to the input terminal of the fifth amplifier 540, and the other side is connected to the reference potential to charge an input signal to the fifth amplifier 540. In addition, during the period φ1 in which the first timing signal is high, one side of the fifth capacitor 582 is connected to the reference potential, and the other side is connected to the output of the fifth amplifier 540 to discharge the electric charge. The fifth capacitor 582 is configured to repeat the period φ1 and the period φ2 to repeat charge and discharge.

For example, the third switching switch 571 and the fourth switching switch 572 are turned off during the first period and turned on during the second period by a control signal. When the third switching switch 571 and the fourth switching switch 572 are turned off and the third switched capacitor circuit 580 is cut off from the feedback circuit of the second integral unit 130, the second integral unit 130 performs an integral operation (feedback coefficient of 1), and when the third switching switch 571 and the fourth switching switch 572 are turned on to connect the third switched capacitor circuit 580 to the feedback circuit, the second integral unit 130 performs an amplification operation (feedback coefficient>1).

The delta-sigma modulator 10 of the present embodiment can receive the signal $A_{IN2}$ according to the feedback signal $A_{FB}$ from the DA converter 170 via the first integral unit 120 to perform the integral operation in the second integral unit 130. At this time, since the signal $A_{IN2}$ according to the feedback signal $A_{FB}$ can be input to the second integral unit 130 at substantially a same gain or error as that at a time when the signal is input to the first integral unit 120, an additional adjustment on the feedback signal $A_{FB}$ is unnecessary. In addition, the delta-sigma modulator 10 of the present embodiment can perform switching for the operation in the second integral unit 130 by using the commonly used reset circuit 190, which is efficient. Therefore, the delta-sigma modulator 10 can perform feedback by using the only single DA converter 170 for a plurality of integrators to reduce a circuit area, and an error of the signals or the like can be reduced.

Figure 6:
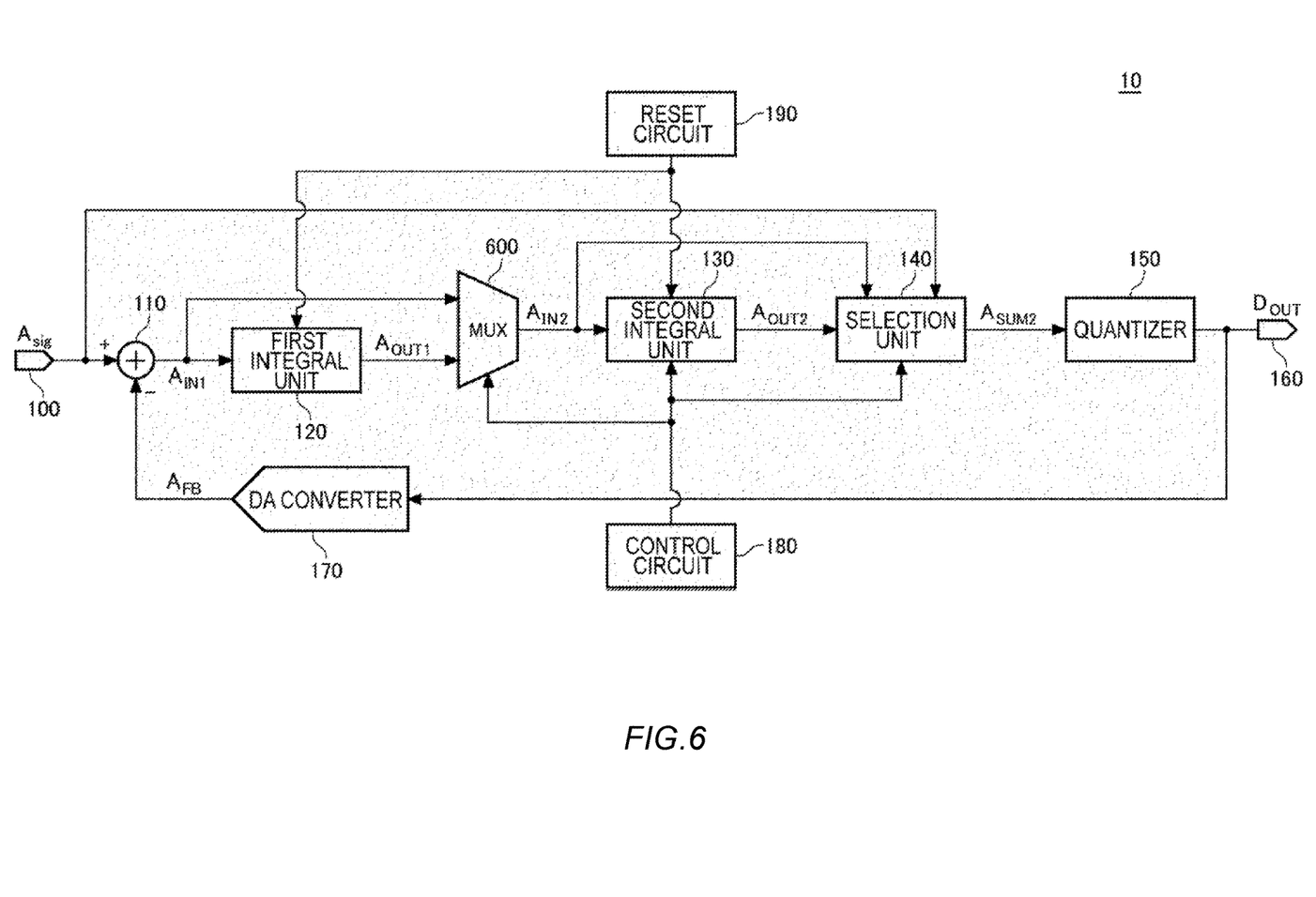
FIG. 6 illustrates the delta-sigma modulator according to the present embodiment.

FIG. 6 illustrates an example of a circuit of the delta-sigma modulator 10 according to the present embodiment. The delta-sigma modulator 10 uses the addition and subtraction unit 110, the first integral unit 120, the second integral unit 130, the selection unit 140, the quantizer 150, the DA converter 170, the control circuit 180, and the reset circuit 190 which are illustrated in FIG. 1. That is, the delta-sigma modulator 10 illustrated in FIG. 6 includes the addition and subtraction unit 110, the first integral unit 120, the second integral unit 130, the selection unit 140, the quantizer 150, the DA converter 170, the control circuit 180, the reset circuit 190, and a multiplexer 160. In the delta-sigma modulator 10 illustrated in FIG. 6, a component similar to the component of the delta-sigma modulator 10 of FIG. 1 may perform an operation similar to that of the delta-sigma modulator 10 of FIG. 1, and hereinafter, an aspect different from the delta-sigma modulator 10 of FIG. 1 will be mainly described.

The addition and subtraction unit 110 is connected to an input terminal 100, the first integral unit 120, and the DA converter 170. The addition and subtraction unit 110 outputs, to the first integral unit 120 and the multiplexer 600, the analog signal $A_{IN1}$ obtained by subtracting the feedback signal $A_{FB}$ output by the DA converter 170 from the analog signal $A_{sig}$ input to the input terminal 100.

The first integral unit 120 is connected to the multiplexer 600, and integrates the analog signal $A_{sig}$ input to the input terminal 100. The first integral unit 120 integrates the analog signal $A_{IN1}$ that is a difference between the analog signal $A_{sig}$ and the feedback signal $A_{FB}$, and outputs the analog signal $A_{out1}$ to the multiplexer 600.

The multiplexer 600 is connected to the second integral unit 130 and the selection unit 140, and is configured to select one of the analog signal $A_{IN1}$ output by the addition and subtraction unit 110 and the analog signal $A_{out1}$ output by the first integral unit 120 and to output the signal $A_{IN2}$ that has been selected to the second integral unit 130 and the selection unit 140. The multiplexer 600 switches selections according to a control signal from the control circuit 180.

The second integral unit 130 is connected to the selection unit 140, integrates the signal $A_{IN2}$ output by the multiplexer 600, and outputs an analog signal $A_{out2}$ to the selection unit 140. The second integral unit 130 may be an analog integrator.

The selection unit 140 is connected to the input terminal 100 and the quantizer 150, selects at least one of the analog signal $A_{sig}$ input to the input terminal 100, the analog signal $A_{IN2}$ output by the multiplexer 600, or the analog signal $A_{out2}$ output by the second integral unit 130, and outputs an analog signal $A_{sum2}$ according to the select signal.

The control circuit 180 is connected to the multiplexer 600, the second integral unit 130, and the selection unit 140, and outputs a control signal for switching operations of the multiplexer 600, the second integral unit 130, and the selection unit 140. The control circuit 180 may switch the operations of the multiplexer 600, the second integral unit 130, and the selection unit 140 at predetermined timing. The control circuit 180 may output different control signals to the multiplexer 600, the second integral unit 130, and the selection unit 140. The control circuit 180 performs control by control signals such that the multiplexer 600 outputs the signal output by the first integral unit 120 to the second integral unit 130 and the selection unit 140 during the first period and outputs the analog signal input to the first integral unit (that is, the signal $A_{IN1}$ output by the addition and subtraction unit 110) to the second integral unit 130 and the selection unit 140 during the second period. With this architecture, the control circuit 180 can control the multiplexer 600 so as to output the feedback signal $A_{FB}$ output by the DA converter 170 to the second integral unit 130 via the first integral unit 120 during the first period, and control the multiplexer 600 so as to output the feedback signal $A_{FB}$ output by the DA converter to the second integral unit 130 without the intermediation of the first integral unit 120 during the second period.

The delta-sigma modulator 10 of the present embodiment receives the signal $A_{IN2}$ according to the feedback signal $A_{FB}$ from the DA converter 170 as it is and performs an integral operation in the second integral unit 130. In addition, as the output result $A_{OUT2}$ to be obtained too, a value represented by Math. 12 is obtained. The present embodiment is effective in a case where a gain adjustment is unnecessary when the signal $A_{IN1}$ according to the feedback signal $A_{FB}$ from the DA converter 170 is input to the first integral unit 120 and when the signal $A_{IN2}$ is input to the second integral unit 130. In addition, the delta-sigma modulator 10 of the present embodiment does not need a control signal from the control circuit for the reset circuit 190, and a logic is simple. Therefore, the delta-sigma modulator 10 of the present embodiment can perform feedback by using the only single DA converter 170 for a plurality of integrators to reduce the circuit area, and an error of signals or the like can be reduced.

While the embodiments of the present invention have been described, the technical scope of the present invention is not limited to the above-described embodiments. It is apparent to persons skilled in the art that various alterations or improvements can be made to the above-described embodiments. It is also apparent from the description of the claims that the embodiments to which such alterations or improvements are made can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A delta-sigma modulator comprising:
a first integral unit configured to integrate an input analog signal;
a second integral unit configured to integrate a signal output by the first integral unit;
a quantizer configured to quantize a signal output by the second integral unit;
a digital-to-analog (DA) converter configured to perform DA conversion on an output of the quantizer and output a feedback signal to be fed back to the first integral unit; and
a control unit configured to perform control to cause the first integral unit and the second integral unit to perform different integral operations during a first period and a second period, wherein
the second integral unit is configured to receive the feedback signal output by the DA converter via the first integral unit and integrate the feedback signal during the first period and the second period, and
the control unit is configured to control the second integral unit to be caused to operate as an integrator in which a feedback coefficient during the second period is higher than a feedback coefficient during the first period.

2. The delta-sigma modulator according to claim 1, wherein
the control unit is configured to control the first integral unit to be caused to operate as an integrator in which a feedback coefficient during the second period is lower than a feedback coefficient during the first period.

3. The delta-sigma modulator according to claim 2, wherein
the control unit is configured to control the first integral unit to be caused to operate as an integrator with a feedback coefficient of 1 during the first period and control the first integral unit to be caused to operate as an integrator with a feedback coefficient of 0 during the second period, and to control the second integral unit to be caused to operate as an integrator with a feedback coefficient of 1 during the first period and control the second integral unit to be caused to operate as an integrator with a feedback coefficient greater than 1 during the second period.

4. The delta-sigma modulator according to claim 2, wherein
the first integral unit is configured to output, to the second integral unit, the feedback signal output by the DA converter at a same gain as a gain at a time when the feedback signal is input to the first integral unit during the second period.

5. The delta-sigma modulator according to claim 2, wherein
the first integral unit includes
an addition unit to which the feedback signal is input,
a first switching unit configured to output a signal, which is to be output by the addition unit, at a gain of 1 during the first period, and to output the signal at a gain of 1 and a gain of 0 alternately during the second period, and
a feedback path for returning an output of the first switching unit to an input of the addition unit, wherein
the first integral unit is configured to output a signal via the feedback path during both the first period and the second period.

6. The delta-sigma modulator according to claim 2, wherein
the second integral unit includes a second switching unit configured to output a signal from the first integral unit with delay during the first period and to output the signal from the first integral unit without delay during the second period.

7. The delta-sigma modulator according to claim 1, wherein
the control unit is configured to control the first integral unit to be caused to operate as an integrator with a feedback coefficient of 1 during the first period and control the first integral unit to be caused to operate as an integrator with a feedback coefficient of 0 during the second period, and to control the second integral unit to be caused to operate as an integrator with a feedback coefficient of 1 during the first period and control the second integral unit to be caused to operate as an integrator with a feedback coefficient greater than 1 during the second period.

8. The delta-sigma modulator according to claim 7, wherein
the first integral unit is configured to output, to the second integral unit, the feedback signal output by the DA converter at a same gain as a gain at a time when the feedback signal is input to the first integral unit during the second period.

9. The delta-sigma modulator according to claim 7, wherein
the first integral unit includes
an addition unit to which the feedback signal is input,
a first switching unit configured to output a signal, which is to be output by the addition unit, at a gain of 1 during the first period, and to output the signal at a gain of 1 and a gain of 0 alternately during the second period, and
a feedback path for returning an output of the first switching unit to an input of the addition unit, wherein the first integral unit is configured to output a signal via the feedback path during both the first period and the second period.

10. The delta-sigma modulator according to claim 7, wherein
the second integral unit includes a second switching unit configured to output a signal from the first integral unit with delay during the first period and to output the signal from the first integral unit without delay during the second period.

11. The delta-sigma modulator according to claim 1, wherein
the first integral unit is configured to output, to the second integral unit, the feedback signal output by the DA converter at a same gain as a gain at a time when the feedback signal is input to the first integral unit during the second period.

12. The delta-sigma modulator according to claim 11, wherein
the first integral unit includes
an addition unit to which the feedback signal is input,
a first switching unit configured to output a signal, which is to be output by the addition unit, at a gain of 1 during the first period, and to output the signal at a gain of 1 and a gain of 0 alternately during the second period, and
a feedback path for returning an output of the first switching unit to an input of the addition unit, wherein the first integral unit is configured to output a signal via the feedback path during both the first period and the second period.

13. The delta-sigma modulator according to claim 11, wherein
the second integral unit includes a second switching unit configured to output a signal from the first integral unit with delay during the first period and to output the signal from the first integral unit without delay during the second period.

14. The delta-sigma modulator according to claim 1, wherein
the first integral unit includes
an addition unit to which the feedback signal is input,
a first switching unit configured to output a signal, which is to be output by the addition unit, at a gain of 1 during the first period, and to output the signal at a gain of 1 and a gain of 0 alternately during the second period, and
a feedback path for returning an output of the first switching unit to an input of the addition unit, wherein the first integral unit is configured to output a signal via the feedback path during both the first period and the second period.

15. The delta-sigma modulator according to claim 14, wherein
the first switching unit includes a first delay element configured to delay a signal output by the addition unit, an amplifier configured to output a signal, which is output by the addition unit, at a gain of 0, and a multiplexer to which an output of the first delay element and an output of the amplifier are input.

16. The delta-sigma modulator according to claim 15, wherein
the delta-sigma modulator is an incremental analog-to-digital (AD) converter configured to perform reset after each cycle of AD conversion for converting the input analog signal into a digital signal, and the multiplexer is configured to output the signal output at a gain of 0 by the amplifier during a period in which the reset is performed.

17. The delta-sigma modulator according to claim 1, wherein
the second integral unit includes a second switching unit configured to output a signal from the first integral unit with delay during the first period and to output the signal from the first integral unit without delay during the second period.

18. The delta-sigma modulator according to claim 17, wherein
the second switching unit includes
a first switched capacitor circuit connected to an output of the first integral unit,
a first switching switch connected to the first switched capacitor circuit,
a second switched capacitor circuit connected in parallel with the first switched capacitor circuit, and
a second switching switch connected to the second switched capacitor circuit, and
the control unit is configured to perform control in a manner that the first switching switch is turned on to discharge from the first switched capacitor circuit during the first period to output the signal from the first integral unit with delay, and the second switching switch is turned on to discharge from the second switched capacitor circuit during the second period to output the signal from the first integral unit without delay during the second period.

19. A delta-sigma modulator comprising:
a first integral unit configured to integrate an input analog signal;
a second integral unit configured to integrate a signal output by the first integral unit;
a quantizer configured to quantize a signal output by the second integral unit;
a digital-to-analog (DA) converter configured to perform DA conversion on an output of the quantizer and output a feedback signal to be fed back to the first integral unit; and
a control unit configured to perform control to cause the first integral unit and the second integral unit to perform different integral operations during a first period and a second period, wherein
the second integral unit is configured to receive the feedback signal output by the DA converter via the first integral unit and integrate the feedback signal during the first period and the second period, and
the control unit is configured to control the first integral unit to be caused to operate as an integrator in which a feedback coefficient during the second period is lower than a feedback coefficient during the first period.

20. A delta-sigma modulator comprising:
a first integral unit configured to integrate an input analog signal;
a multiplexer configured to select and output a signal output by the first integral unit and the input analog signal;
a second integral unit configured to integrate a signal output by the multiplexer;
a quantizer configured to quantize a signal output by the second integral unit;
a digital-to-analog (DA) converter configured to perform DA conversion on an output of the quantizer and output a feedback signal to be fed back to the first integral unit; and
a control unit configured to perform control to cause the first integral unit and the second integral unit to perform different integral operations during a first period and a second period, wherein
the control unit is configured to control the second integral unit to be caused to operate as an integrator in which a feedback coefficient during the second period is higher than a feedback coefficient during the first period, and
the control unit is configured to control the multiplexer to output, to the second integral unit, a signal output by the first integral unit during the first period, and to control the multiplexer to output, to the second integral unit, the analog signal input to the first integral unit during the second period.

* * * * *